(12) United States Patent
Kawano et al.

(10) Patent No.: US 10,983,022 B2
(45) Date of Patent: Apr. 20, 2021

(54) PRESSURE SENSOR

(71) Applicant: DENSO CORPORATION, Kariya (JP)

(72) Inventors: Shinji Kawano, Kariya (JP); Kazuaki Mawatari, Kariya (JP)

(73) Assignee: DENSO CORPORATION, Kariya (JP)

( * ) Notice: Subject to any disclaimer, the term of this patent is extended or adjusted under 35 U.S.C. 154(b) by 198 days.

(21) Appl. No.: 16/273,740

(22) Filed: Feb. 12, 2019

(65) Prior Publication Data

US 2019/0178738 A1 Jun. 13, 2019

Related U.S. Application Data (63) Continuation of application No. PCT/JP2017/030222, filed on Aug. 24, 2017.

(30) Foreign Application Priority Data

Sep. 6, 2016 (JP) .............................. JP2016-173921

(51) Int. Cl.
| | | |
|---|---|---|
| *G01L 9/00* | (2006.01) | |
| *G01L 19/06* | (2006.01) | |
| *G01L 9/02* | (2006.01) | |
| *G01L 19/14* | (2006.01) | |
| *H01L 29/84* | (2006.01) | |

(52) U.S. Cl.
CPC .............. *G01L 9/0041* (2013.01); *G01L 9/00* (2013.01); *G01L 9/02* (2013.01); *G01L 19/06* (2013.01); *G01L 19/0645* (2013.01); *G01L 19/148* (2013.01); *H01L 29/84* (2013.01)

(58) Field of Classification Search
CPC . G01L 9/0041; G01L 9/00; G01L 9/02; G01L 9/0042; G01L 9/0054; G01L 19/00; G01L 19/06; G01L 19/0645; G01L 19/0627
USPC ........................................................... 73/715
See application file for complete search history.

(56) References Cited

U.S. PATENT DOCUMENTS

2014/0360252 A1* 12/2014 Yamamoto .............. B81C 3/005
73/64.48

FOREIGN PATENT DOCUMENTS

| JP | H10-300605 A | 11/1998 |
|---|---|---|
| JP | 2005-326338 A | 11/2005 |
| JP | 2012-026956 A | 2/2012 |
| JP | 2012-154801 A | 8/2012 |
| JP | 2012-212797 A | 11/2012 |
| JP | 2015-197367 A | 11/2015 |

(Continued)

*Primary Examiner* — Tarun Sinha
(74) *Attorney, Agent, or Firm* — Posz Law Group, PLC (57) ABSTRACT

A pressure sensor detects a pressure of a pressure transmitting medium. The pressure sensor includes a sensor substrate and a protection film. The sensor substrate includes a recess recessed relative to a periphery thereof and a thin portion thinner than the periphery due to the recess. The protection film is provided on a bottom surface of the recess that is one side of the thin portion and a part of a lateral surface of the recess, and the protection film suppresses an adhesion of a contamination contained in the pressure transmitting medium. The pressure sensor includes an adhesion suppressing portion that includes an uneven section formed in at least a part of the lateral surface, and a liquid repellent film repellent to liquid in the pressure transmitting medium and provided as the protection film on the uneven section to exhibit a lotus effect.

8 Claims, 4 Drawing Sheets

(56) References Cited

FOREIGN PATENT DOCUMENTS

| | | |
|---|---|---|
| JP | 2016-118494 A | 6/2016 |
| JP | 2016-142674 A | 8/2016 |
| WO | WO-2016125451 A1 * | 8/2016 ............ H01L 29/84 |

* cited by examiner

PRESSURE SENSOR

CROSS REFERENCE TO RELATED APPLICATION

The present application is a continuation application of International Patent Application No. PCT/JP2017/030222 filed on Aug. 24, 2017, which designated the U.S. and claims the benefit of priority from Japanese Patent Application No. 2016-173921 filed on Sep. 6, 2016. The entire disclosures of all of the above applications are incorporated herein by reference.

TECHNICAL FIELD

The present disclosure relates to a pressure sensor.

BACKGROUND

A general pressure sensor includes a protection portion is provided on a surface of a recess to suppress an adhesion of an object (hereinafter, contamination) interfering with a pressure detection to the surface of the recess. The protection portion is formed of a fluorine resin film, a fluorine resin sheet, or a fluorine gel, for example.

SUMMARY

A pressure sensor of an aspect according to the present disclosure detects a pressure of a pressure transmitting medium. The pressure sensor includes a sensor substrate and a protection film. The sensor substrate includes a recess recessed relative to a periphery thereof and a thin portion thinner than the periphery due to the recess. The protection film is provided on a bottom surface of the recess that is one side of the thin portion and a part of a lateral surface of the recess, and the protection film suppresses an adhesion of a contamination contained in the pressure transmitting medium. The recess on which the protection film is provided and the thin portion are to be placed in the pressure transmitting medium, and the thin portion is configured to detect the pressure of the pressure transmitting medium. The pressure sensor includes an adhesion suppressing portion that includes an uneven section formed in at least a part of the lateral surface, and a liquid repellent film repellent to liquid in the pressure transmitting medium and provided as the protection film on the uneven section to exhibit a lotus effect.

EMBODIMENTS

Hereinafter, embodiments for implementing the present disclosure will be described referring to drawings. In each of the embodiments, the same reference numerals are assigned to portions corresponding to the items described in the preceding embodiments, and a repetitive description of the same portions may be omitted. In each of the embodiments, when only a part of the configuration is described, the other parts of the configuration can be applied to the other embodiments described above. The parts may be combined even if it is not explicitly described that the parts can be combined. The embodiments may be partially combined even if it is not explicitly described that the embodiments can be combined, provided there is no harm in the combination.

As follows, multiple embodiments for implementing the present disclosure will be described with reference to the drawings. In each embodiment, portions corresponding to those described in the preceding embodiment are denoted by the same reference numerals, and redundant descriptions will be omitted in some cases. In each of the embodiments, when only a part of the configuration is described, the other parts of the configuration can be applied with reference to the other embodiments described above.

First Embodiment

A pressure sensor 100 of a first embodiment of the present disclosure will be described with reference to FIGS. 1, 2, 3. The pressure sensor 100 is used for, for example, detecting a pressure of intake air drawn into an engine, detecting a pressure of exhaust gas of an EGR (Exhaust Gas Recirculation) system, or detecting a pressure of an engine lubricant lubricating parts of an engine. That is, the pressure sensor 100 is used for detecting a pressure of a pressure transmitting medium such as intake air, exhaust gas, and an engine lubricant.

Figure 1:
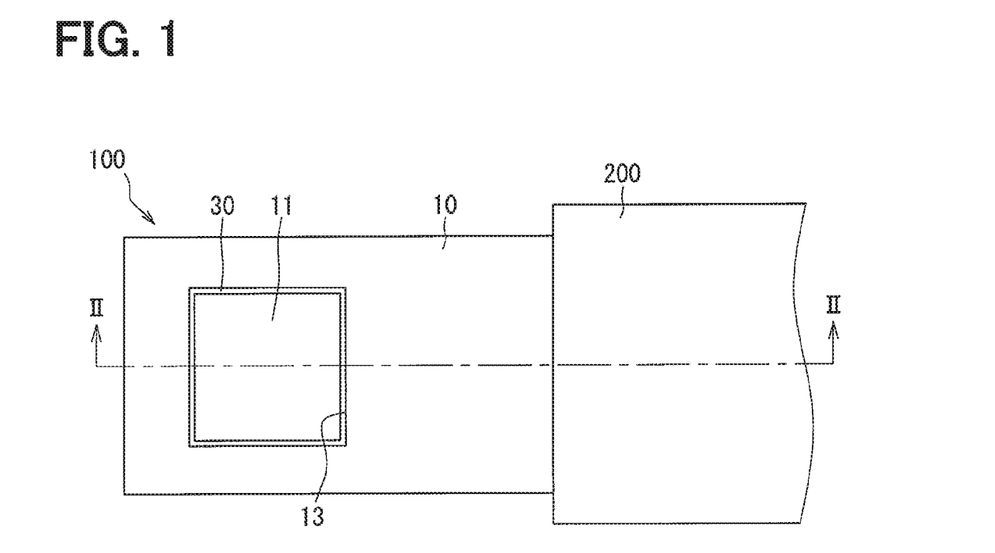
FIG. 1 is a plan view showing a schematic configuration of a pressure sensor according to a first embodiment of the present disclosure.
Figure 2:
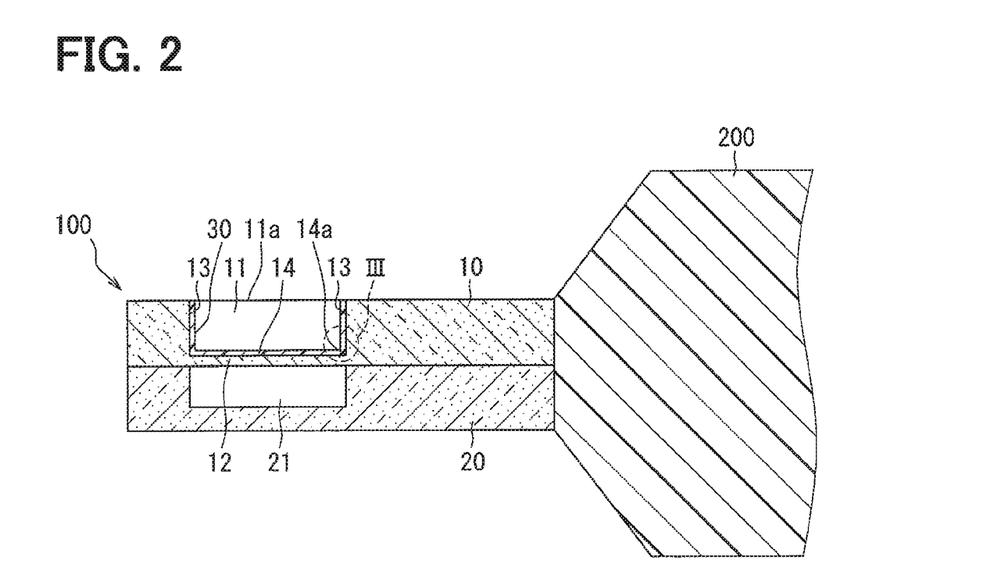
FIG. 2 is a cross-sectional view taken along a line II-II of FIG. 1.

The pressure sensor 100 is connected with a circuit portion 200 as shown in FIGS. 1, 2. The circuit portion 200 includes a circuit chip processing output signals of the pressure sensor 100, a wire electrically connecting the pressure sensor 100 to the circuit chip, and a lead for output from the circuit portion 200. The circuit portion 200 includes, for example, a sealing resin that integrally seals the circuit chip, the wire, and a part of the lead. The sealing resin further seals a part of the pressure sensor 100.

The pressure sensor 100 includes a sensor substrate 10 and a protection film 30. In the present embodiment, the pressure sensor 100 includes a coupled substrate 20 bonded to the sensor substrate 10.

The sensor substrate 10 is a flat member made of semiconductor such as silicon. The coupled substrate 20 is a flat member made of semiconductor, glass or the like. The sensor substrate 10 has a front surface and a back surface that is a reverse side of the front surface, and the coupled substrate 20 is bonded to the back surface. The sensor substrate 10 and the coupled substrate 20 are bonded to form a flat structure. For example, each of the front surface and the back surface of the sensor substrate 10 has a rectangular shape. Each of a surface of the coupled substrate 20 facing the sensor substrate 10 and the other surface of the coupled substrate 20 has a rectangular shape.

The coupled substrate 20 has, on the surface facing the sensor substrate 10, a pressure reference space 21 recessed from its periphery as shown in FIG. 2. The pressure reference space 21 is located so as to face a pressure receiving portion 12 described later. The pressure reference space 21 is in a vacuum state when the sensor substrate 10 and the coupled substrate 20 are bonded.

The sensor substrate 10 has a recess 11 that is a bottomed hole having an open end 11a on the front surface side and recessed relative to its periphery, as shown in FIGS. 1, 2. The sensor substrate 10 has a pressure receiving portion 12 at which the sensor substrate 10 is thinner than the periphery of the pressure receiving portion 12 because of the recess 11. That is, the pressure receiving portion 12 is a part facing the recess 11. The pressure receiving portion 12 may correspond to a thin portion.

The recess 11 covered with the protection film 30 described later and the pressure receiving portion 12 of the pressure sensor 100 are placed in the pressure transmitting medium. The pressure receiving portion 12 has a function for detecting the pressure of the pressure transmitting medium. The recess 11 and the pressure receiving portion 12 may be exposed to the pressure transmitting medium.

A thickness of the pressure receiving portion 12 is about 10 μm, for example, and is thinner than a part of the sensor substrate 10 around the pressure receiving portion 12. Since the pressure receiving portion 12 changes its shape, i.e. is deformed, in response to the pressure exerted by the pressure transmitting medium flowing into the recess 11 from the open end 11a, the pressure receiving portion 12 may be called a diaphragm.

A deformation gauge whose resistance value changes based on a displacement of the pressure receiving portion 12 due to the pressure exerted by the pressure transmitting medium is formed in the pressure receiving portion 12. A bridge circuit whose resistance value changes based on the displacement of the pressure receiving portion 12 due to the pressure is formed in the pressure receiving portion 12. The pressure sensor 100 is configured to output an output signal (electric signal) representing the pressure by using the change of the resistance value.

The recess 11 is defined by an annular lateral surface 13 and a bottom surface 14 continuously extending from the lateral surface 13. The lateral surface 13 may be bent from a bottom surface rim 14a that is a rim of the bottom surface 14. That is, the bottom surface rim 14a is a boundary between the lateral surface 13 and the bottom surface 14.

In the present embodiment, the recess 11 has an opening having a square shape, 250 μm on a side, and a depth of the recess 11 is about 250 μm, for example. The recess 11 is defined by four lateral surfaces 13 and one bottom surface 14. The recess 11 may be a space defined by the lateral surfaces 13 and the bottom surface 14. The bottom surface 14 is one side of the pressure receiving portion 12. Since the bottom surface receives the pressure of the pressure transmitting medium, the bottom surface may be called a pressure receiving surface.

Figure 3:
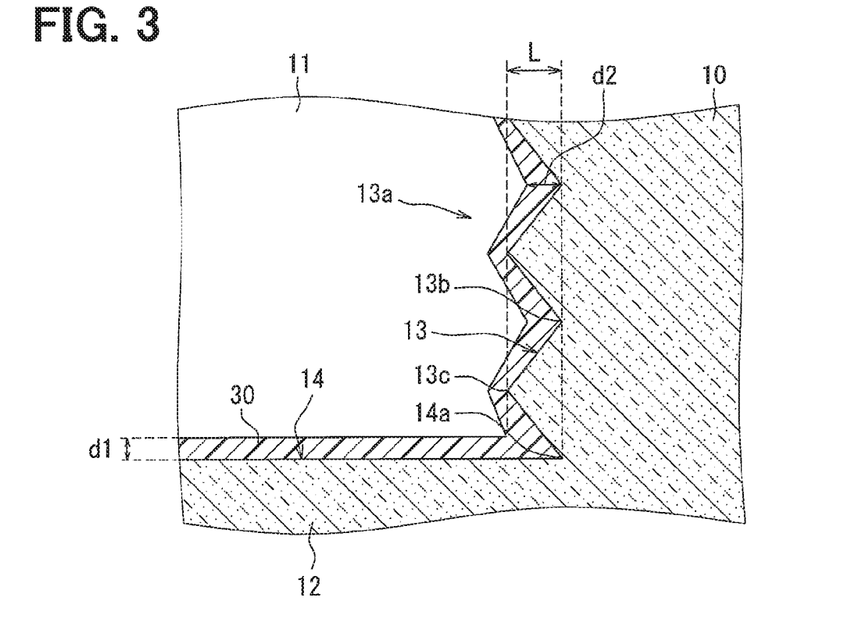
FIG. 3 is an enlarged view of a part encircled with a dashed line III of FIG. 2.

An uneven section is formed in at least a part of the lateral surface 13 of the sensor substrate 10 as shown in FIG. 3. The uneven section is formed in at least a part of the lateral surface 13 of the sensor substrate 10 in an area from the boundary between the bottom surface 14 and the lateral surface 13 to the open end 11a, and the uneven section is provided all around the lateral surface 13. The uneven section may be formed throughout the lateral surfaces 13 of the sensor substrate 10.

The sensor substrate 10 has multiple peak portions and multiple valley portions. Since the sensor substrate 10 is formed to have the peak portions, valley portions are formed between the peak portions. Reference numeral 13b in FIG. 3 is the bottom of the valley portion. Reference numeral 13c is the vertex of the peak portion.

The uneven section has Ra between 50 nm and 10000 nm, for example. The character L of FIG. 3 represents a height from the bottom 13b to the vertex 13c. The height L can be called a length between a first imaginary line and a second imaginary line. The first imaginary line extends from the bottom surface rim 14a to the open end 11a so as to connect the bottoms 13b of one lateral surface 13. The second imaginary line extends from the bottom surface rim 14a to the open end 11a so as to connect the vertices 13c of the one lateral surface 13. The first imaginary line and the second imaginary line are shown with dashed lines in FIG. 3. In the present embodiment, the first imaginary line and the second imaginary line are perpendicular to the bottom surface 14.

The shape of the uneven section is not limited. For example, conical peak portions and valley portions therebetween, pyramid peak portions and valley portions therebetween, circular column peak portions and valley portions therebetween, or prism peak portions and valley portions therebetween can be used as the shape of the uneven section.

As shown in FIGS. 2, 3, the protection film 30 is provided on at least a part of the lateral surface 13 of the recess 11 and the bottom surface 14 of the recess that is one side defining the pressure receiving portion 12. The protection film 30 provided on the lateral surfaces 13 covers at least the uneven section of the lateral surfaces 13. When the lateral surfaces 13 have a flat portion in which the uneven section is not formed, the protection film 30 may be provided on the uneven section and a part of the flat portion.

The lateral surfaces 13 may be entirely covered with the protection film 30. In contrast, the bottom surface 14 is entirely covered with the protection film 30. That is, the recess 11 may be entirely covered with the protection film 30.

Liquid (water and oil) in the pressure transmitting medium contains contaminations such as soot. The protection film 30 limits the contaminations from adhering. The protection film 30 is provided for limiting the contaminations from adhering to a surface of the recess 11, particularly to the bottom surface 14 that contributes to the accuracy of the pressure detection.

In detail, the protection film 30 repellent to the liquid in the pressure transmitting medium. The contact angle between the protection film 30 and liquid in the pressure transmitting medium is at or above 90 degrees. It is preferable that the contact angle between the protection film 30 and liquid in the pressure transmitting medium is large because the larger contact angle leads to the higher liquid repellency. The protection film 30 is formed through a method such as applying and drying, a plasma coating, a sputtering, and a vapor deposition.

It is preferable that the following aspects in addition to the liquid repellency are taken into account to select the material of the protection film 30. The protection film 30 is also formed on the pressure receiving portion 12. Accordingly, the material of the protection film 30 has the liquid repellency and preferably is unlikely to deteriorate the deformation properties of the pressure receiving portion 12. For example, a material having a low elastic modulus is preferable. The material of the protection film 30 can preferably form a thin film.

The pressure sensor 100 is mounted on a vehicle. Accordingly, the material of the protection film 30 has the liquid repellency and preferably an excellent heat resistance and an excellent chemical resistance in the environment on which the pressure sensor 100 is mounted.

The material of the protection film 30 preferably is thin and has a low elastic modulus, an excellent heat resistance and an excellent chemical resistance. Accordingly, a fluorine resin may be preferable as the material of the protection film 30.

The reference characters d1 and d2 represent thickness of the protection film 30. The thickness d1 is a thickness of a part of the protection film 30 formed on the bottom surface 14. The thickness d1 is preferably as thin as possible so as not to deteriorate the deformation properties of the pressure receiving portion 12.

The thickness d2 is a thickness of a part of the protection film 30 that is the thickest in a part of the protection film 30 formed on the uneven section. A part of the protection film 30 on the valley portion of the uneven section is likely to be the thickest in the protection film 30 on the uneven section. The height L is preferably equal to or larger than the thickness d2. According to this, the valley portions of the uneven section of the pressure sensor 100 can be limited from being buried by the protection film 30.

When the liquid in the pressure transmitting medium is water, the protection film 30 has water repellency. When the liquid in the pressure transmitting medium is oil, the protection film 30 has oil repellency.

The pressure sensor 100 includes the protection film 30 for limiting the contaminations from adhering to the recess 11. However, in some cases such as a case where the content of the contaminations is high, the capacity of the protection film 30 may be insufficient depending on the state of the pressure transmitting medium, and the adhesion of the contamination to the recess 11 may not be avoided.

The pressure sensor 100 includes an adhesion suppressing portion 13a for improving the effect in suppressing adhesion of the contaminations to the recess 11, as shown in FIG. 3. The adhesion suppressing portion 13a is a part in which the protection film 30 is provided on the uneven section of the lateral surfaces 13 to exhibit a lotus effect. As described above, the uneven section is formed in at least a part of the lateral surfaces 13. Accordingly, the adhesion suppressing portion 13a is provided in at least a part of the lateral surfaces 13. The protection film 30 provided on the uneven section corresponds to a liquid repellent film. The adhesion suppressing portion 13a may be a part of the protection film 30 provided on the uneven section.

Since the protection film 30 is provided such that the uneven section of the lateral surface 13 remains uneven, the liquid repellency can be higher due to the shape of the lateral surface 13 in addition to the liquid repellency of the protection film 30. That is, an adhesion of the contamination to the recess 11 of the pressure sensor 100 is suppressed by the lotus effect of the adhesion suppressing portion 13a in addition to the function of the protection film 30.

As described above, in the pressure sensor 100, the protection film 30 for suppressing an adhesion of the contamination contained in the pressure transmitting medium is provided on the bottom surface 14 of the recess 11 that is one side of the pressure receiving portion 12 and at least a part of the lateral surface 13 of the recess 11. Accordingly, an adhesion of the contamination contained in the pressure transmitting medium to a part of the pressure sensor 100 in which the protection film 30 is provided can be suppressed.

The pressure sensor 100 includes the adhesion suppressing portion 13a in which the liquid repellent film is provided on the uneven section to exhibit a lotus effect. Since the liquid repellent film is provided on the uneven section, the adhesion suppressing portion 13a exhibits a lotus effect in addition to the liquid repellency of the liquid repellent film, and accordingly the contamination is unlikely to adhere to the adhesion suppressing portion 13a compared to a case where the liquid repellent film is provided on a flat part of the lateral surface 13. Accordingly, the pressure sensor 100 can improve the effect of suppressing the adhesion of the contamination to the recess portion 11. Accordingly, the adhesion of the contamination to the recess 11 can be suppressed regardless of a condition of the pressure transmitting medium.

Since the adhesion suppressing portion 13a is provided in the lateral surface 13 of the recess 11 of the pressure sensor 100, the contamination can be limited from accumulating on the lateral surface 13 to reach the pressure receiving portion 12. Accordingly, a decrease of pressure detection accuracy of the pressure sensor 100 can be suppressed.

It may be preferable that the adhesion suppressing portion 13a is not provided on the bottom surface 14. When an uneven section is formed in the pressure receiving portion 12, the unevenness may affect the pressure detection, and accordingly the detection accuracy of the pressure sensor 100 may be deteriorated. When the adhesion suppressing portion 13a is not provided on the bottom surface 14, that is, when the uneven section is not formed in the bottom surface, the decrease of the detection accuracy of the pressure sensor 100 can be suppressed.

However, the present disclosure is not limited to this specific example. The adhesion suppressing portion 13a may be provided on the bottom surface 14 of the pressure sensor 100. That is, the pressure sensor 100 may include the adhesion suppressing portion 13a in which the protection film 30 is provided on the uneven section formed in the bottom surface 14 to exhibit a lotus effect. According to this, the pressure sensor 100 can improve the effect of suppressing the adhesion of the contamination. That is, the adhesion of the contamination to the bottom surface 14 of the pressure sensor 100 can be further suppressed.

The contamination may be likely to adhere around the boundary between the lateral surface 13 and the bottom surface 14. If the contamination accumulates around the boundary between the lateral surface 13 and the bottom surface 14, the accumulated contamination may reach the pressure receiving portion 12. Accordingly, it is preferable that the protection film 30 is provided on the uneven section that is formed in a part of the lateral surface 13 extending in a predetermined range from the bottom surface rim 14a that is the boundary between the lateral surface 13 and the bottom surface 14. According to this, the contamination can be limited from accumulating to reach the pressure receiving portion 12 of the pressure sensor 100.

The thickness d2 is preferably equal to or larger than the thickness d1. According to this, since the thickness of the protection film 30 provided on the bottom surface 14 can be thin, the effect on the deformation property can be suppressed, and high liquid repellency can be remained. The valley portions of the pressure sensor 100 can be limited from being buried by the protection film 30, thereby a lotus effect can be remained.

The function of the protection film 30 provided on the bottom surface 14 may be different from the function of the protection film 30 provided on the lateral surface 13. For example, a film having a lyophilic property may be used as the protection film 30 provided on the bottom surface 14 of the pressure sensor 100. A material of the protection film 30 having a lyophilic property may be a coating film such as silica-based film, a film made of an organic hydrophilizing agent, and a DLC (diamond-like carbon) film.

It can be determined according to the pressure transmitting medium whether a film having a lyophilic property is used as the protection film 30 provided on the bottom surface 14. For example, when the liquid in the pressure transmitting medium is water, it is preferable that the protection film 30 provided on the bottom surface 14 has a lyophilic property. When the pressure transmitting medium is water, the protection film 30 may be hydrophilic. Similarly, when the pressure transmitting medium is oil, the protection film 30 may be lipophilic.

The protection film 30 is lyophilic to liquid of the pressure transmitting medium. The contact angle between the protection film 30 and liquid in the pressure transmitting medium is at or below 90 degrees. It is preferable that the contact angle between the protection film 30 and liquid in the pressure transmitting medium is small because the smaller contact angle leads to the higher lyophilic property. The protection film 30 is formed through a method such as applying and drying, a plasma coating, a sputtering, and a vapor deposition.

Accordingly, liquid in the pressure transmitting medium may adhere preferentially than the contamination to the bottom surface 14 of the pressure sensor 100. Accordingly, the contamination passes the pressure sensor 100 without adhering to the protection film 30 provided on the bottom surface 14.

Modifications

In the pressure sensor 100 of the modified example, the protection film 30 is a lyophilic film lyophilic to liquid of the pressure transmitting medium. The protection film 30 of the adhesion suppressing portion 13a is a lyophilic film. The other configurations are the same as the above described embodiment, so the above embodiment can be referred to. Further, this modified example can also be applied to other embodiments.

As described above, in the pressure sensor 100 of the modified example, the protection film 30 for suppressing an adhesion of the contamination contained in the pressure transmitting medium is provided on the bottom surface 14 of the recess 11 that is one side of the pressure receiving portion 12 and at least a part of the lateral surface of the recess 11. Accordingly, an adhesion of the contamination contained in the pressure transmitting medium to a part of the pressure sensor 100 of the modified example in which the protection film 30 is provided can be suppressed.

The pressure sensor 100 of the modified example includes the adhesion suppressing portion 13a in which the lyophilic film is provided on the uneven section to increase the lyophilic property. Since the lyophilic film is provided on the uneven section, the adhesion suppressing portion 13a exhibits a higher lyophilic property than the lyophilic property of the lyophilic film itself, and the contamination is more unlikely to adhere than a case where the lyophilic film is provided on a flat lateral surface 13.

In the pressure sensor 100 of the modified example, liquid in the pressure transmitting medium is preferentially adhere than the contamination to the protection film 30 provided on the adhesion suppressing portion 13a. According to this, the adhesion of the contamination to the adhesion suppressing portion 13a can be suppressed. Accordingly, the pressure sensor 100 of the modified example can improve the effect in the adhesion of the contamination to the recess 11. Accordingly, the pressure sensor 100 of the modified example can suppress the adhesion of the contamination to the recess 11 regardless of the state of the pressure transmitting medium.

In the pressure sensor 100 of the modified example, since the adhesion suppressing portion 13a is provided on the lateral surface of the recess, the contamination can be limited from accumulating on the lateral surface to reach the pressure receiving portion. According to the present disclosure, a decrease of pressure detection accuracy can be suppressed.

A film having liquid repellency may be used as the protection film 30 provided on the bottom surface 14 of the pressure sensor 100 of the modified example. When the pressure transmitting medium is air containing water vapor, the contamination in the water vapor may adhere to the recess 11. In the pressure sensor 100 of the modified example, since the protection film 30 provided on the bottom surface 14 has a liquid repellency and the protection film 30 of the adhesion suppressing portion 13a has a lyophilic property, the adhesion of the contamination to the recess 11 can be further suppressed.

The preferred embodiment of the present disclosure has been described herein. However, the present disclosure is not limited to the above embodiment. Various modifications may be made without departing from the scope and spirit of the present disclosure. Second to fourth embodiments and modified examples are described as the other embodiments below. The above described techniques can be combined with second to fourth embodiments.

Second Embodiment

Figure 4:
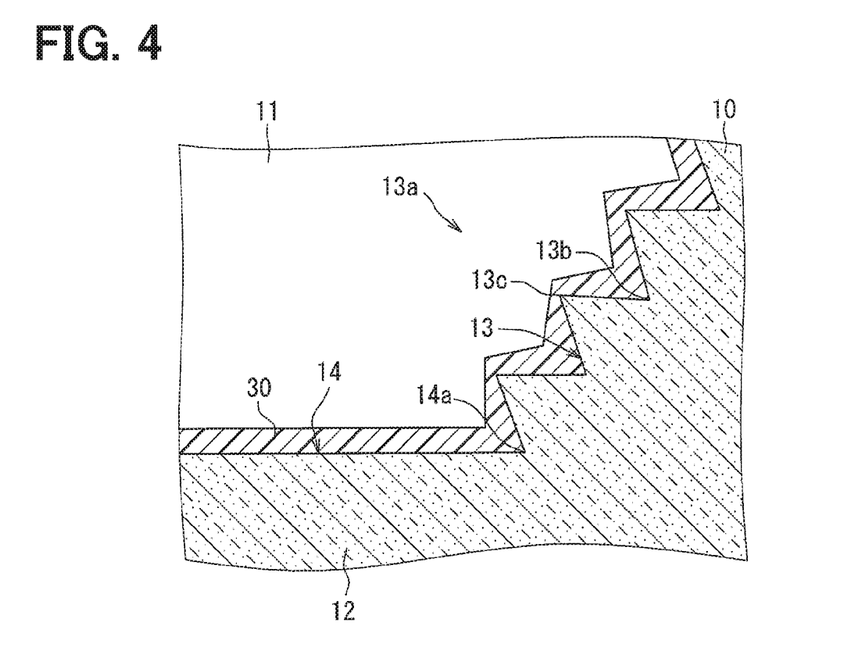
FIG. 4 is a cross-sectional view showing a schematic configuration of a pressure sensor according to a second embodiment of the present disclosure.

A pressure sensor of a second embodiment will be described with reference to FIG. 4. FIG. 4 is an enlarged view corresponding to FIG. 3. The same reference numerals as the above embodiment are used for convenience.

An opening area of an open end 11a of the recess 11 of the pressure sensor 100 is larger than an area of the bottom surface 14. That is, in the pressure sensor 100, an angle between the bottom surface 14 and the lateral surface 13 is an obtuse angle as shown in FIG. 4. In the pressure sensor 100, an angle between the bottom surface 14 and the first imaginary line, and an angle between the bottom surface 14 and the second imaginary line are obtuse angles.

In the pressure sensor 100, the opening area of the recess 11 may be larger than that of the above embodiment when the area of the bottom surface 14 is the same as the above embodiment. Accordingly, since the flow speed of the pressure transmitting medium in the recess 11 becomes higher, the pressure sensor 100 exhibits an effect of washing away the contamination in addition to the effect of the protection film 30 and the effect of the adhesion suppressing portion 13a. That is, the pressure sensor 100 limits the contamination from staying in the recess 11. Accordingly, the pressure sensor 100 can further suppress the adhesion of the contamination compared to the above embodiment.

Third Embodiment

Figure 5:
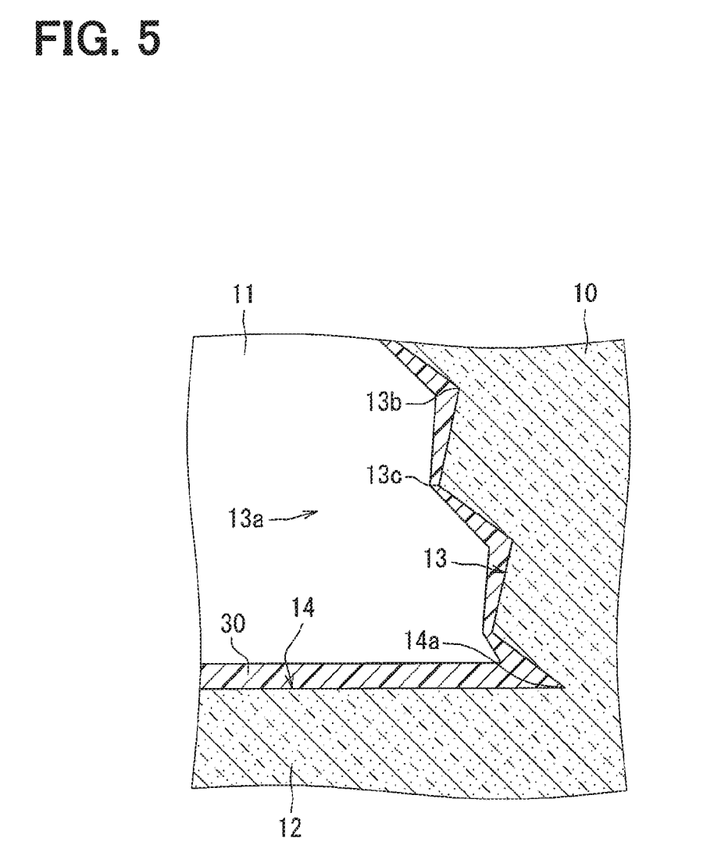
FIG. 5 is a cross-sectional view showing a schematic configuration of a pressure sensor according to a third embodiment of the present disclosure.

A pressure sensor of a third embodiment will be described with reference to FIG. 5. FIG. 5 is an enlarged view corresponding to FIG. 3. The same reference numerals as the above embodiment are used for convenience.

An opening area of an open end 11a of the recess 11 of the pressure sensor 100 is smaller than an area of the bottom surface 14. That is, in the pressure sensor 100, an angle between the bottom surface 14 and the lateral surface 13 is an acute angle as shown in FIG. 5. In the pressure sensor 100, an angle between the bottom surface 14 and the first imaginary line, and an angle between the bottom surface 14 and the second imaginary line are acute angles.

In the pressure sensor 100, the opening area of the recess 11 may be smaller than that of the above embodiment as long as the area of the bottom surface 14 is the same as the above embodiment. Accordingly, the pressure sensor 100 exhibits an effect of limiting the contamination from entering the recess 11 in addition to the effect of the protection film 30 and the effect of the adhesion suppressing portion 13a. Accordingly, the pressure sensor 100 can further suppress the adhesion of the contamination compared to the above embodiment.

Fourth Embodiment

A pressure sensor of a fourth embodiment will be described with reference to FIG. 6. The same reference numerals as the above embodiment are used for convenience.

Figure 6:
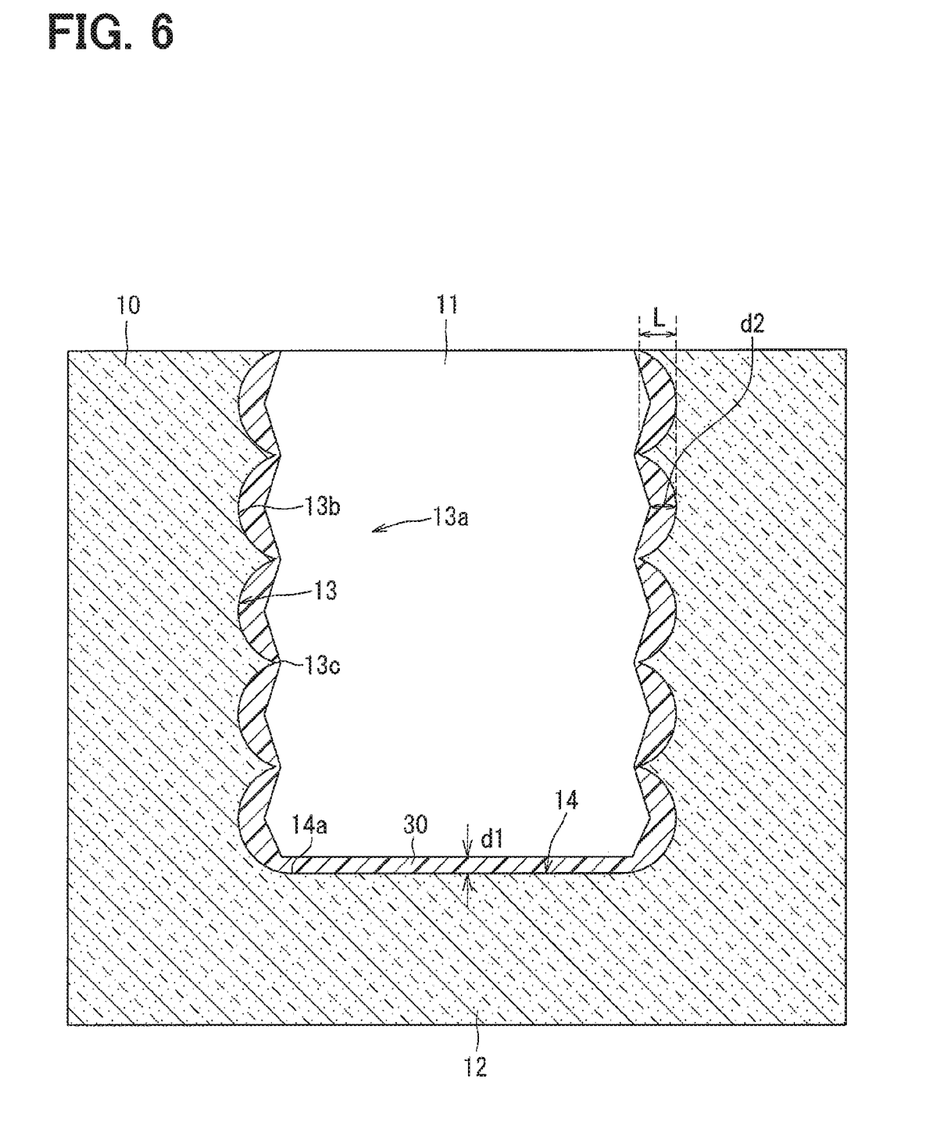
FIG. 6 is a cross-sectional view showing a schematic configuration of a pressure sensor according to a fourth embodiment of the present disclosure.

As shown in FIG. 6, in the pressure sensor 100, the recess 11 is formed by an anisotropic dry etching of silicon. In the pressure sensor 100, unevenness is formed on the lateral surface 13 when the recess 11 is formed. In the pressure sensor 100, the protection film 30 is formed on the uneven section to provide the adhesion suppressing portion 13a. The pressure sensor 100 exhibits the same effects as the first embodiment.

Although the present disclosure has been described in accordance with the examples, it is understood that the present disclosure is not limited to the above examples or structures. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A pressure sensor that detects a pressure of a pressure transmitting medium, the pressure sensor comprising:
  a sensor substrate including
    a recess recessed relative to a periphery thereof, and
    a thin portion thinner than the periphery due to the recess;
  a protection film provided on a bottom surface of the recess that is one side of the thin portion and at least a part of a lateral surface of the recess, the protection film suppressing an adhesion of a contamination contained in the pressure transmitting medium, wherein
  the recess and the thin portion are to be placed in the pressure transmitting medium,
  the thin portion is configured to detect the pressure of the pressure transmitting medium,
  the bottom surface has no unevenness,
  the pressure sensor further comprises:
  an adhesion suppressing portion including
    an uneven section formed in at least a part of the lateral surface, and
    a liquid repellent film repellent to liquid in the pressure transmitting medium and provided as the protection film on the uneven section to exhibit a lotus effect.

2. A pressure sensor that detects a pressure of a pressure transmitting medium, the pressure sensor comprising:
  a sensor substrate including
    a recess recessed relative to a periphery thereof, and
    a thin portion thinner than the periphery due to the recess;
  a protection film provided on a bottom surface of the recess that is one side of the thin portion and at least a part of a lateral surface of the recess, the protection film suppressing an adhesion of a contamination contained in the pressure transmitting medium, wherein
  the recess and the thin portion are to be placed in the pressure transmitting medium,
  the thin portion is configured to detect the pressure of the pressure transmitting medium,
  the pressure sensor further comprises:
  an adhesion suppressing portion including
    an uneven section formed in at least a part of the lateral surface, and
    a lyophilic film having a lyophilic property to liquid in the pressure transmitting medium and provided as the protection film on the uneven section to increase the lyophilic property.

3. The pressure sensor according to claim 1, wherein a height from a bottom of a valley portion of the uneven section to a vertex of a peak portion of the uneven section is equal to or larger than a thickness of a part of the protection film provided on the uneven section.

4. The pressure sensor according to claim 1, wherein the uneven section of the adhesion suppressing portion is formed in a part of the lateral surface within a predetermined area from a boundary between the lateral surface and the bottom surface, and the protection film is provided on the uneven section.

5. The pressure sensor according to claim 4, wherein a thickness of a part of the protection film provided on the uneven section is equal to or larger than a thickness of a part of the protection film provided on the bottom surface.

6. The pressure sensor according to claim 1, wherein the adhesion suppressing portion is not provided on the bottom surface.

7. The pressure sensor according to claim 1, wherein an opening area of the recess on an open end of the recess is larger than an area of the bottom surface.

8. The pressure sensor according to claim 1, wherein an opening area of the recess on an open end of the recess is smaller than an area of the bottom surface.

* * * * *